(12) United States Patent
Goldstein

(10) Patent No.: US 6,277,740 B1
(45) Date of Patent: *Aug. 21, 2001

(54) INTEGRATED CIRCUIT TRENCHED FEATURES AND METHOD OF PRODUCING SAME

(76) Inventor: Avery N. Goldstein, 26336 Wyoming, Huntington Woods, MI (US) 48070

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/373,295

(22) Filed: Aug. 12, 1999

Related U.S. Application Data

(60) Provisional application No. 60/096,616, filed on Aug. 14, 1998.

(51) Int. Cl.[7] .................................................. H01L 21/44
(52) U.S. Cl. ........................ 438/660; 438/610; 438/672; 257/770
(58) Field of Search ............................ 438/610, 660–663, 438/666, 672, 685, 686, 687, 700; 257/768, 769, 770, 774

(56) References Cited

U.S. PATENT DOCUMENTS

| | | | |
|---|---|---|---|
| 4,466,850 | 8/1984 | Eichelberger et al. | 156/276 |
| 4,569,876 | 2/1986 | Nakakita . | |
| 4,613,648 | 9/1986 | Usala | 524/555 |
| 4,655,864 | 4/1987 | Rellick | 156/89 |
| 4,726,991 | 2/1988 | Hyatt et al. | 428/329 |
| 4,923,739 | 5/1990 | Jin et al. | 428/221 |
| 5,073,518 | 12/1991 | Doan et al. | 437/180 |
| 5,151,168 | 9/1992 | Gilton et al. | 205/123 |
| 5,262,357 | 11/1993 | Alivisatos et al. | 437/233 |
| 5,559,057 | 9/1996 | Goldstein | 437/228 |
| 5,576,248 | * 11/1996 | Goldstein | 438/488 |
| 5,624,741 | 4/1997 | Scott | 428/210 |
| 5,670,279 | 9/1997 | Goldstein | 430/5 |
| 5,728,626 | 3/1998 | Allman et al. . | |
| 5,953,629 | 9/1999 | Imazeki et al. . | |

FOREIGN PATENT DOCUMENTS

| | | |
|---|---|---|
| 0 980 094 A1 | 2/2000 | (EP) . |
| 0 980 097 A2 | 2/2000 | (EP) . |

* cited by examiner

*Primary Examiner*—Kevin M. Picardat
(74) *Attorney, Agent, or Firm*—Gifford, Krass, Groh, Sprinkle, Anderson & Citkowski, P.C.

(57) ABSTRACT

The formation of microelectronic structures in trenches and vias of an integrated circuit wafer are described using nanocrystal solutions. A nanocrystal solution is applied to flood the wafer surface. The solvent penetrates the trench recesses within the wafer surface. In the process, nanocrystals dissolved or suspended in the solution are carried into these regions. The solvent volatilizes more quickly from the wafer plateaus as compared to the recesses causing the nanocrystals to become concentrated in the shrinking solvent pools within the recesses. The nanocrystals become stranded in the dry trenches. Heating the wafer to a temperature sufficient to sinter or melt the nanocrystals results in the formation of bulk polycrystalline domains. Heating is also carried out concurrently with nanocrystals solution deposition. Copper nanocrystals of less than about 5 nanometers are particularly well suited for formation of interconnects at temperatures of less than 350 degrees Celcius.

38 Claims, No Drawings

INTEGRATED CIRCUIT TRENCHED FEATURES AND METHOD OF PRODUCING SAME

RELATED APPLICATIONS

This application claims the benefit of provisional patent application Ser. No. 60/096,616 which was filed Aug. 14, 1998 and is hereby incorporated by reference.

FIELD OF THE INVENTION

The present invention relates to microelectronic trenched feature formation and more particularly to the formation of an interconnect from a nanocrystal solution.

BACKGROUND OF THE INVENTION

An integrated circuit requires conductive interconnects between semiconducting domains in order to communicate signals therebetween. In order to create ever faster microprocessors, smaller dimension interconnects of higher conductivity materials is an ongoing goal.

As microelectronic efficiencies have increased interconnects have decreased in dimensional size and efforts have been made to increase the electrical conductivity of interconnect features. There is an ongoing need for ever smaller interconnects.

The rapid miniaturization of interconnects is occurring simultaneously with the transition from Al to Cu metallization for sub-0.25 $\mu$m ICs. The transition from Al to Cu has led to a change in the way interconnects are formed. While Al has been deposited as a blanket layer which is then patterned by reactive ion etching, Cu interconnects are formed by evaporative deposition into preformed (damascene) trenches and vias followed by chemical mechanical polishing (CMP).

As the interconnect width decreases and the aspect ratio increases, conventional vacuum deposition techniques approach the theoretical resolution threshold. Deep, narrow trenches and vias preferentially collect material at the damascene feature edges, leading to void formation. Blanket and selective chemical vapor deposition (CVD) are well established Cu deposition techniques that have a demonstrated ability to fill current interconnect trenches. (A. E. Kaloyeros and M. A. Fury, MRS Bull., (Jun. 1993), pp. 22–29).

Nonetheless, CVD does not inherently fill trenches preferentially over any other portion of substrate having nucleation sites. Unlike CVD, the proposed method preferentially deposits Cu into trenches based on differential solvent evaporation associated with trenches and as such is expected to work better, the narrower the trench width and higher the aspect ratio. Additionally, heating of the IC substrate during CVD to assure crystalline growth degrades fine architecture structures on the substrate. Thus, the semiconductor industry is in need of an interconnect formation process capable of achieving higher resolution at lower temperature and ideally, at a lower cost.

The mesoscopic size regime between atoms and bulk materials is characterized by unusual properties. Mesoscopic systems exhibit collective atomic behavior, but not to a sufficient extent so as to preclude quantized effects. Many of the unusual thermodynamic and spectroscopic anomalies associated with mesoscopic systems are attributable to surface effects. Studies have shown surface energies that are 10 to 400% greater for nanocrystals than for bulk Au and Pt, (C. Solliard and M. Flueli, Surf. Sci. 156, (1985), pp. 487–494) and Al (J. Wolterdorf, A. S. Nepijko and E. Pippel, Sur. Sci. 106, (1981), pp. 64–72). In the bulk, surface atoms represent such a small percentage of the total that surface effects are largely inconsequential. Surfaces generally possess modified atomic coordination numbers, geometries and diminished lattice energies relative to the bulk. The result of these modifications is that physical, spectroscopic, and thermodynamic properties, which are constant in the bulk, become size dependent variables in nanocrystals. The ability to modify the thermodynamic properties of nanocrystals, particularly the melting temperature, is exploited in the present invention to produce thin film IC structures at low temperature.

Metallic nanocrystals have been shown to reduce melting temperatures compared with the bulk. (Ph. Buffat and J-P. Borel, Phys. Rev. A, 13, (1976), pp. 2287–2298. 2287–2298; C. J. Coombes, J. Phys., 2, (1972), pp. 441–449; J. Eckert, J. C. Holzer, C. C. Ahn, Z. Fu and W. L. Johnson, Nanostruct. Matls., 2, (1993). 407–413.; C. R. M. Wronski, Brit. J. Appl. Phys. 18, (1967), pp. 1731–1737 and M. Wautelet, J. Phys. D, 24, (1991), 343–346). The depression in melting and annealing temperature is evident throughout the nanocrystal size regime, with the most dramatic effects observed in nanocrystals having a diameter from 2 to 6 nm. Melting studies on a range of nanocrystals have established that the melting temperature is size dependent in the nanometer size regime and is approximately proportional to the inverse particle radius regardless of the material identity. The size dependent melting temperature of metallic nanocrystals has included studies of Au, Pb and In, Al and Sn. (Au: Ph. Buffat and J-P. Borel, Phys. Rev. A, 13, (1976), 2287–2298. 2287–2298; Pb and In: C. J. Coombes, J. Phys., 2, (1972), 441–449; Al: J. Eckert, J. C. Holzer, C. C. Ahn Z. Fu and W. L. Johnson, Nanostruct. Matls, 2, (1993), 407–413; and Sn: C. R. M. Wronski, Brit. J. Appl. Phys. 18, (1967), 1731–1737). The reduction in melting temperature as a function of nanocrystal size can be enormous. For example, 2 nm Au nanocrystals melt at about 300° C., as compared to 1065° C. for bulk gold. (M. Wautelet, J. Phys. D, 24, (1991), 343–346).

SUMMARY OF THE INVENTION

A method is described for producing a structure including the application of a solvent containing metal containing nanocrystals to a wafer having a trench cut therein. The nanocrystals having a diameter of between 2 and 20 nanometers. Heating the nanocrystals to form a continuous polycrystalline domain from the nanocrystals within the trench. The present invention is an alternative method of producing such features on a trenched wafer at small dimensions and with a reduced melting temperature. The nanocrystals are preferably copper nanocrystals when the structure is destined to form an interconnect. A microelectronic structure is also formed including nanocrystalline domains in electrical contact with one another, said domains formed to an existing recess within a wafer substrate. The use of nanocrystals to form microelectronic structures in an existing recess within a wafer substrate is also taught.

DETAILED DESCRIPTION OF THE INVENTION

A method is detailed herein which uses a Damascene process to create interconnects from nanocrystalline precursors materials. While the present invention is not limited to a particular metal, or metallic cation-containing compound such as an oxide, nitride, phosphide, or intermetallic, it is particularly well suited for the efficient formation of copper interconnects at temperatures below 400 degrees Celsius and even below 300 degrees Celsius. A silicon wafer that has been patterned by lithography and etched to form a series of trenches is the substrate for the instant invention the exposed surface of which also contains $SiO_2$. It is appreciated that an intermediate wetting layer is optionally applied to the substrate to promote interconnect wetting thereof and to prevent interdiffusion during subsequent IC processing.

The present invention identifies significant cost efficiencies based on the deposition characteristics of nanocrystal-based construction of electronic devices. The nanocrystal solutions or suspensions are applied by spray or spin coating onto a trenched integrated circuit (IC) wafer. The present invention supplants expensive vacuum evaporation equipment with a paint booth or spin coating technology for the formation of integrated circuitry interconnect structures. Unlike chemical and physical vapor deposition techniques, the present invention selectively deposits nanocrystal particulate in the IC trenches by taking advantage of the slower volatilization of a solvent carrier from trenches, causing the nanocrystals to congregate in high aspect ratio features. As a result, the quantity of extraneous deposition material, which must be removed by CMP, is diminished. Lastly, an environmental benefit results from pre-selecting aqueous and or benign organic solvents the nanocrystal solution, in place of solvents currently used in the chip manufacturing process.

The present invention also identifies cost savings associated with production defects. Nanocrystal deposition of interconnects is both reversible and repairable. Poor deposition technique is corrected by resolubilizing nanocrystals stranded on a trenched IC substrate by solvent washing prior to sintering the nanocrystals. Further, trench regions showing incomplete filling or separation from the trench walls can be remedied after sintering or melting to form bulk material interconnect features through the reapplication of a nanocrystal solution. Because the solvent containing the nanocrystals can freely penetrate fissures and voids associated with an IC patterned for an interconnect, additional nanocrystals are deposited into poorly filled regions.

A nanocrystal solution is applied to flood the wafer surface. The solvent penetrates the trench recesses within the wafer surface, including those shadowed or otherwise obscured from evaporative methods. In the process nanocrystals dissolved or suspended in the solution are carried into these regions. The solvent volatilizes more quickly from the wafer plateaus as compared to the recesses causing the nanocrystals to become concentrated in the shrinking solvent pools within the recesses. The nanocrystals become stranded in the dry trenches. Heating, the wafer to a temperature sufficient to sinter or melt the nanocrystals results in the formation of bulk polycrystalline domains.

In the case of many technologically important interconnect materials such as copper, the intermediate layer is illustratively a layer of TiN or TaN having a sufficient thickness to assure continuity. Other such intermediate layers are formed by evaporation of a base metal layer onto the trenched substrate and thereafter exposing the base metal layer to a nitrogen plasma to induce a surface nitriding as is conventional to the art.

A solution of dissolved or suspended nanocrystals is applied to the contoured surface of the wafer. Preferably, the nanocrystal solution or suspension is concentrated to opaqueness to facilitate rapid deposition of interconnect structures. Following the evaporation of the solvent, adjacent particles are heated to form bulk domains within the trenches. Extraneous nanocrystal material is removed from exposed surfaces by conventional wafer polishing techniques subsequent to heating or by swabbing the wafer plateau with a dry or solvent impregnated lint-free cloth prior to heating.

The solvent utilized to form the solution is optionally aqueous or organic. The solvent is chosen based on factors including, but not limited to hydrophilicity of the wafer surface, solubility of the nanocrystals therein, vapor pressure, toxicity, purity and the like.

The nanocrystal is defined as a particle having a linear dimension in any direction on the order of nanometers, namely 1 to 100 nm in diameter. Preferably, the nanocrystal of the present invention is between 2 and 20 nm. More preferably, the nanocrystal of the present invention is between 2 and 10 nm. The size distribution of the nanocrystals in solution is of some importance, since the sintering temperature of particles in this size regime is size dependent. Likewise, the melting temperature is size dependent. Preferably, a size distribution of less than 30% of the average particle diameter is used for nanocrystals of an average diameter of less than about 6 nm with increasingly greater tolerances being preferred as the average particle increases beyond 6 nm. The nanocrystals are optionally either dispersed in a solvent by conventional means illustratively including sonication, agitation, solution shearing and the like; or the nanocrystal surface is coupled to a passivating agent by adsorption or chemically bonding thereto. The passivating agent preferably being soluble in the solvent and thus imparting solubility to the particles. Preferably, the nanocrystals are soluble to promote segregation into low volatilization rate, trench and via regions as compared to wafer plateaus. More preferably, the nanocrystals are copper for the formation of an interconnect.

The passivating agent is introduced to prevent nanocrystal growth beyond a pre-selected size and preferably to also impart solubility on the nanocrystal in a solvent. The passivating agent illustratively includes a variety of thermally volatile organics including those of the formula XRY where X is a moiety Capable of chemically bonding to a surface atom of the nanocrystal and illustratively includes alcohol, amine, carboxylate, ketone, thiol, imide, amide, sulfonyl, nitryl, aldehyde, and phosphorus containing moeities; R is $C_1$–$C_{30}$ aliphatic, aryl or heteroatom substituted derivative thereof and Y is X or hydrogen. The RY portion of the passivating agent is optionally chosen to interact with the solvent to impart solubility. In another embodiment, Y bonds to the surface of a second nanocrystal to tether nanocrystals together. Further, dendritic or polymeric variants of XRY are operative to form an extended matrix of nanocrystals. Preferably, the passivating agent is a linear $C_2$–$C_{24}$ alkane—thiol, amine, carboxylate or phosphorus-containing moiety. The nanocrystal surface binding passivating agent moiety being dictated by established organometallic chemistry.

The nanocrystal size is selected to take advantage of size dependent sintering and melting temperatures. The stability of the underlying wafer architecture is typically the controlling factor in determining optimal melting temperature and thus nanocrystal size. Preferably, nanocrystals are selected having a maximal heating requirement to obtain desired electrical conductivities from the resulting bulk structure of less than about 350 degrees Celsius. More preferably, the nanocrystals are heated to less than 300 degrees Celsius. The melting temperature of various sizes of nanocrystals is calculable (Wautelet J. Phys. D 24 (1991) 343).

Nanocrystals are applied to the water by applying the solution thereto. Layering a solution of the instant invention onto a wafer is operative. Preferably, the solution is applied in such a way as to promote uniform deposition of the nanocrystals across whole wafers, such methods illustratively include atomizing the solution and applying as a fine nanocrystal paint spray; and spin coating the solution onto a rotating wafer. Optionally, a binder is dispersed inn the solution to minimize particle movement as the solvent pool evaporates. A binder useful in the present invention includes low molecular weight and polymeric organic substances. The binder being chosen such that upon heating to a temperature of less than about 250 to 300 degrees Celsius, the binder is volatilized. The binder is chosen to minimize binder residues, the residues likely to decrease conductivity of the bulk domain resulting from heating the nanocrystals. Binders illustratively include waxes; aliphatic compounds containing at least eight carbon atoms including carboxylic acids alcohols, aldehydes, amines, thiols and salt thereof wherein the cation is a conductive metal ion illustratively including copper aluminum, magnesium, gold, silver, manganese, molybdenum and the like; polymeric materials which volatilize to greater than 95% by weight below 250 degrees Celsius including poly (acrylic acid), polyglycols, polycarbonates, polyalkyls, polyalcohols, polyesters and the like; proteinaceans substrates such as albumin, gelatin and collagen; carbohydrates; and organosilanes.

The nanocrystals of the instant invention are composed of any material that is conventionally used to create interconnect structures, intermediate layers or barrier structures in microelectronics. These materials illustratively include: aluminum, copper, gold, manganese, molybdenum, nickel, palladium, platinum, tin, zinc, tantalum, titanium and silver, alloys, oxides, nitrides and phosphides thereof. Further, in instance where one wishes to create a metal-oxide-semiconductor (MOS) junction intermediate or barrier structures, nanocrystals of the metallic elements may be deposited and oxidized to positive oxidation state greater than zero by heating to a temperature of less than 500 degrees Celsius or subjecting the metal to a gaseous plasma in an atmosphere of the gaseous oxidant. The metallic elements being oxidized to form a variety of metal compounds including oxides, nitrides, and phosphides. Alternately, nanocrystals of the oxides are synthesized and stranded directly into IC wafer trenches and vias. It is appreciated that upon heating metallic nanocrystals in order to form conductive structures, it may be necessary to perform such heating under an inert or reducing atmosphere to prevent unwanted oxidation. Nanocrystals of various compositions may be mixed together and heated to form intermetallic composition interconnects. Simultaneous sintering and or fusion of the differing composition nanocrystals are assured through the choice of particle sizes.

There are three temperature ranges important to the process of converting a trench of wafer filled with nanocrystals into an operative IC structure. The nanocrystal application temperature occurs at any temperature at which to solvent is liquid. It is appreciated that higher application temperature decreases the number of wafer surface sites a nanocrystal contacts prior to being stranded on a dry wafer. In a preferred embodiment, the nanocrystal surface is coated with a passivating agent that imparts solvent solubility to the nanocrystal. Upon heating a nanocrystal filled wafer above the passivating agent thermalization temperature, the passivating agent is volatilized allowing clean nanocrystal surfaces of contiguous nanocrystals into contact. While the passivating agent volatilization temperature is largely size independent and related to the chemisorption or physisorption energy between the passivating agent and the nanocrystal surface atoms, nanocrystal sintering and melting temperature are controllable over hundreds of degrees Celsius through nanocrystal size domain selection. One the passivating agent is volatilized contiguous nanocrystals are able to sinter.

Sintering is defined as the interfacial coalescence of contiguous particles while the particle cores retain prior crystalline properties. Sintering temperature is calculable or approximated as two thirds of the substance melting temperature in degrees Kelvin. Further, heating beyond the sintering temperature brings the nanocrystals to a size dependent melting temperature. Melting of a contiguous matrix of nanocrystals results in a densified polycrystalline bulk structure.

The present invention is capable of overcoming prior art limitations regarding dimensional shrinkage associated with densification, thin film instability through repetitive nanocrystal solution application. (K. T. Miller et al. J. Mater Res. 5 (1990) 151–160; B. A. Korgel and D. Fitzmaurice Phys. Rev. Let 80 (1998) 3531–3534; A. G. Evans et al. J. Mater Res. 3 (1988) 1043–1049).

Significant shrinkage is associated with passivating agent volatilization thus after applying a nanocrystal solution to a wafer, the wafer is heated to the passivating agent volatilization temperature and additional nanocrystal solution applied to fill feature voids associated with volatilization. This process is optionally repeated prior to raising the wafer to a sintering of melting temperature for the nanocrystal mass filling a wafer trench or via. It is appreciated that nanocrystal deposition is optionally carried out at a temperature above the passivating agent volatilization temperature such that active nanocrystal surfaces are formed upon contact with a trenched wafer.

The relevant volatilization sintering and melting temperatures for a given nanocrystal solution are determinable through thermals analysis, techniques such as differential scanning calorimetry (DSC), thermal gravimetric analysis (TGA), temperature dependent spectroscopies and conductivity.

In another embodiment, the passivating agent is an electrically conductive polymer that electrically couples contiguous nanocrystals to one another obviating the need for passivating agent volatilization.

In instances where the interconnect is being deposited onto a silicon oxide surface other factors need to be considered. Metals often poorly wet oxide surfaces and thus an intermediate conventional adhesion-promoting layer is applied. In those instances where a hydrophobic solvent is used to coat a hydrophilic oxide surface, the solvent can be induced to wet the oxide surface by washing the wafer surface with a silanol or similar surfactant prior to deposition of the particle containing solvent. The silanol wash creates a thin layer that projects organic functionalities away from the surface which attractively interact with the particle surfaces of hydrophobic particles and simultaneously bonds to the oxide surface through the hydroxyl functionality. It is appreciated that other adhesion promoters known to the art of laminating non-wettable oxide and metallic layers are operative herein under the disclosed thermal conditions.

In order to fill a trench with a conductive interconnect, there must be enough particles present such that the particles as deposited are at or above the percolation threshold. The percolation threshold is defined herein as a spatial density of particles sufficient to traverse the region through at least one continuous pathway of contiguous particles. To assure percolation threshold attainment and therefore conductivity upon sintering or fusing the particles, a trench feature is preferably at least 7 particle widths in the directions parallel to the wafer surface. Thus, the instant invention is best utilized with trench features larger than about 7 nm.

Having described the inventions, the following illustrative examples are provided which are not intended to limit the scope of the invention.

EXAMPLE 1

A solution of 3 nm gold nanocrystals passivated with dodecanethiol are synthesized using the method of Leff et al, J. Phys. Chem. 99, (1995) 7036. The gold particles are redissolved in toluene and the toluene solution pipetted onto a trenched silicon wafer having a silicon dioxide surface and a 50 nm layer of TiN over 100 nm of Ti and trench widths of from 5 microns to 0.2 microns. The solution is reddish-black in color and leaves a black film on the wafer following solvent evaporation. The wafer is then allowed to air dry and then heated in air for 2 hours at 300 degrees Celsius. Upon heating the black film of gold nanocrystals takes on a metallic yellowish hue of bulk gold. The surface shows no traces the dodecanethiol passivating agent as determined by X-ray Photospectroscopy (XPS). The gold is observed to be preferentially deposited in the trenches, as compared to the wafer upper surface.

EXAMPLE 2

The procedure of Example 1 is repeated with the particles dissolved in hexane in place of toluene, with similar results.

EXAMPLE 3

The nanocrystals of Example 1 are spun coated at 300 rpm onto a rotating trenched wafer. Upon light reflectance associated with the wafer trench pattern being obscured by the black nanocrystal deposits thereon, the wafer is heated to 150 degrees Celsius for 20 minutes. Greater than 99.9% of the dodecanethiol is observed to volatilize according to TGA. Additional nanocrystal solution is applied to the wafer. Following drying, the wafer is heated to 300 degrees Celsius resulting in complete filling of the wafer trenches with bulk gold features. Few isolated gold domains are observed on the wafer plateau.

EXAMPLE 4

The procedure of Example 3 is repeated after dissolving one part by weight of paraffin in the nanocrystal solution per 50 parts toluene. The solution is atomized onto the wafer and allowed to dry. Upon heating as above, a more uniform distribution of particles across the wafer plateau and trenches is noted.

EXAMPLE 5

The procedure of Example 3 is repeated with copper nanocrystals made by a preparation analogous to Leff et al. with copper (II) chloride used in place of hydrogen tetrachloroaurate and the amine substituted for the thiol. The particles are synthesized in batches having average sizes ranging from 1.5 to 6 nm by adjusting the molar ratio to passivating molecule to copper. The copper particles are heated in a reducing atmosphere of 10% hydrogen and 90% nitrogen at 300 degrees Celsius for 2 hours. A metallic sheen characteristic of bulk copper is observed.

EXAMPLE 6

Copper nanocrystals and silver nanocrystals of 3 and 3.5 nm, respectively, are made as per A. Manna et al., Chem. Mater 9 (1997), 3032–3036. The nanocrystals are mixed with 3 nm Au nanocrystals to a Au: Cu: Ag total weight ratio of 7:78:15 and dissolved in hexane. The nanocrystal is spray coated using a paint sprayer onto a trenched wafer, prior to heating to 350 degrees Celsius. The wafer features are wholly filled with metal having a resistivity consistent with literature values.

EXAMPLE 7

The procedure of Example 3 is repeated with the nanocrystal solution applied to a wafer heated to 150 degrees Celsius. Following solution application, the wafer is heated to 350 degrees Celsius to yield a bulk gold interconnects in the wafer trenches.

EXAMPLE 8

The procedure of Example 7 is repeated with the nanocrystal solution applied to a wafer at 350 degrees Celsius. Bulk gold is observed coating the plateau and trenches uniformly.

It is appreciated that various modification of the present invention in addition to those shown and described herein will be apparent to those skilled in the art from the above description. Such modifications are also intended to fall within the scope of the appended claims.

All references cited herein are intended to be incorporated by reference to the same extent as if each was individually and explicitly incorporated by reference.

What is claimed is:

1. A method for producing a structure comprising:
    applying a solvent comprising metal containing nanocrystals dissolved therein to a wafer having a trench cut therein, said nanocrystals having a diameter of between 2 and 20 nanometers; and
    heating said wafer to form a continuous polycrystalline domain from said nanocrystals within said trench.

2. The method of claim 1 wherein said nanocrystals are composed of a material selected from the group consisting of: aluminum, copper, gold, silver, manganese, molybdenum, nickel, palladium, platinum, tin, zinc, tantalum, titanium, alloys, oxides, nitrides and phosphides thereof.

3. The method of claim 1 wherein said solvent further comprises a binder.

4. The method of claim 1 wherein applying and heating are performed simultaneously.

5. The method of claim 1 wherein said nanocrystals are copper.

6. The method of claim 1 wherein said continuous polycrystalline domain comprises sintered nanocrystals.

7. The method of claim 1 wherein said continuous polycrystalline domain comprises melted nanocrystals.

8. The method of claim 1 wherein said wafer is heated to less than 350 degrees Celsius.

9. The method of claim 2 wherein said structure is an intermediate layer and said nanocrystals are selected from the group consisting of titanium, titanium nitride, tantalum and tantalum nitride.

10. A method of producing a microelectronic interconnect comprising:
    applying a solution comprising soluble copper nanocrystals to a wafer having a trench cut therein, said copper nanocrystals having a diameter of between 2 nm and 10 nm; and
    heating said wafer to form a continuous polycrystalline copper interconnect with said trench.

11. The method of claim 10 wherein applying and heating are performed simultaneously.

12. The method of claim 10 wherein applying said solution involves spin coating.

13. The method of claim 10 wherein applying said solution involves spray coating.

14. A microelectronic structure comprising:
nanocrystalline domains having melting temperatures of less than 350 degrees Celsius in electrical contract with one another, said domains formed to an existing recess within a wafer substrate.

15. The structure of claim 14 wherein said domains having dimension of 2 to 10 nanometers.

16. The structure of claim 14 wherein said domains comprise an element or compound selected from the group consisting of: aluminum, copper, gold, manganese, molybdenum, nickel, palladium, platinum, tin, zinc, tantalum, titanium and silver, alloys, oxides, nitrides and phosphides thereof.

17. The structure of claim 14 wherein said domains comprise copper.

18. The use of passivated metallic nanociystals to form a microelectronic structure in an existing recess within a wafer substrate.

19. The use of claim 18 wherein said nonocrystals are copper.

20. The use of claim 18 wherein said structure is an interconnect.

21. The use of claim 18 wherein said structure is an intermediate layer.

22. A method for producing a structure comprising:
applying a solvent comprising metal containing nanocrystals to a wafer having a trench cut therein, said nanocrystals having a diameter of between 2 and 20 nanometers; and
heating said wafer to less than 350 degrees Celsius form a continuous polycrystalline domain from said nanocrystals within said trench.

23. The method of claim 22 wherein said nanociystals are composed of a material selected from the group consisting of: aluminum, copper, gold, silver, manganese, molybdenum, nickel, palladium, platinum, tin, zinc, tantalum, titanium, alloys, oxides, nitrides and phosphides thereof.

24. The method of claim 22 wherein said nanociystals dissolved in said solvent.

25. The method of claim 22 wherein said solvent further comprises a binder.

26. The method of claim 22 wherein applying and heating are performed simultaneously.

27. The method of claim 22 wherein said nanocrystals are copper.

28. The method of claim 22 wherein said continuous polycrystalline domain comprises sintered nanocrystals.

29. The method of claim 22 wherein said continuous polycrystalline domain comprises melted nanocrystals.

30. The method of claim 22 wherein said structure is an intermediate layer and said nanocrystals are selected from the group consisting of titanium, titanium nitride, tantalum and tantalum nitride.

31. A microelectronic structure comprising:
passivated nanocrystalline domains in said domains formed to an existing recess within a wafer substrate.

32. The stricture of claim 31 wherein said domains having dimension of 2 to 10 nanometers.

33. The structure of claim 31 wherein said domains comprise an element or compound selected from the group consisting of: aluminum, copper, gold, manganese, molybdenum, nickel, palladium, platinum, tin, zinc, tantalum, titanium and silver, alloys, oxides, nitrides and phosphides thereof.

34. The stricture of claim 31 wherein said domains comprise copper.

35. The use of metallic nanocrystals having a melting temperature less than 350 degrees Celsius to form a microelectronic structure in an existing recess within a wafer substrate.

36. The use of claim 35 wherein said nanocrystals are copper.

37. The use of claim 35 wherein said structure is an interconnect.

38. The use of claim 35 wherein said structure is an intermediate layer.

* * * * *